United States Patent
Kim et al.

(10) Patent No.: US 9,329,225 B2
(45) Date of Patent: May 3, 2016

(54) TESTING DEVICE, TEST SYSTEM INCLUDING THE SAME, AND METHOD THEREOF

(75) Inventors: Yun-Cheol Kim, Yongin-Si (KR); Chang-Ho Lee, Asan-Si (KR); Jin-Ho Choi, Asan-si (KR); Min-Woo Kim, Cheonan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 1187 days.

(21) Appl. No.: 13/310,116

(22) Filed: Dec. 2, 2011

(65) Prior Publication Data

US 2012/0150459 A1    Jun. 14, 2012

(30) Foreign Application Priority Data

Dec. 10, 2010  (KR) .................. 10-2010-0126151

(51) Int. Cl.
*G01R 31/28*    (2006.01)

(52) U.S. Cl.
CPC ........ *G01R 31/2812* (2013.01); *G01R 31/2813* (2013.01)

(58) Field of Classification Search
CPC ................... G01R 31/2812; G01R 31/2813
USPC ........................................................ 702/58
See application file for complete search history.

(56) References Cited

U.S. PATENT DOCUMENTS

| 2003/0006783 | A1 | 1/2003 | Min et al. |
| 2006/0097741 | A1* | 5/2006 | Payman ................. 324/765 |
| 2006/0114247 | A1 | 6/2006 | Brown |

FOREIGN PATENT DOCUMENTS

| KR | 2000-0067032 | 11/2000 |
| KR | 10-0815244 | 3/2008 |

* cited by examiner

*Primary Examiner* — Janet Suglo
(74) *Attorney, Agent, or Firm* — Muir Patent Law, PLLC

(57) ABSTRACT

A testing device includes a signal sensing unit and a signal processing unit. The signal sensing unit generates a test output signal by sensing a signal from a device under test including a plurality of passive elements that are connected in parallel. The signal processing unit detects an open-type fault of the plurality of passive elements by measuring an impedance of the device under test based on element characteristic information of the plurality of passive elements.

12 Claims, 14 Drawing Sheets

US 9,329,225 B2

TESTING DEVICE, TEST SYSTEM INCLUDING THE SAME, AND METHOD THEREOF

CROSS-REFERENCE TO RELATED APPLICATIONS

This U.S. non-provisional application claims priority under 35 U.S.C. §119 to Korean Patent Application No. 2010-0126151 filed on Dec. 10, 2010 in the Korean Intellectual Property Office (KIPO), the entire content of which is incorporated herein by reference in its entirety.

BACKGROUND OF THE INVENTION

1. Field of the Invention

The present general inventive concept relates to testing devices and a method thereof. More particularly, the present general inventive concept relates to testing devices that accurately detect an open-type fault and test systems including testing devices, and a method thereof.

2. Description of the Related Art

When detecting a fault of passive elements of a semiconductor module on which semiconductor devices are mounted, limitations due to the mounted semiconductor devices on a printed circuit board have to be considered. For example, the limitations may include an error caused by an electrical response of the semiconductor devices, a limited range of a test voltage to be applied, etc. Particularly in a case where the passive elements are connected in parallel, the limitations make it difficult and inaccurate to detect an open-type fault of the passive elements. An open-type fault includes a fault that occurs when elements are disconnected within a circuit. Generally, the faulty element detection needs to be performed within the limitations such that a result of the faulty element detection may not be affected by a configuration or an operation of the semiconductor devices. Further, since an impedance of the semiconductor module may change according to an electrical condition for testing the semiconductor devices, the faulty element detection may not be accurately performed.

SUMMARY OF THE INVENTION

The present general inventive concept provides a testing device to detect an open-type fault of passive elements based on electrical characteristic information of the passive elements.

The present general inventive concept also provides a test device including the testing device.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a testing device including a signal sensing unit to generate a test output signal by sensing a signal from a device under test, the device under test including a plurality of passive elements that are connected in parallel, and a signal processing unit to detect an open-type fault of the plurality of passive elements by measuring an impedance of the device under test based on element characteristic information of the plurality of passive elements.

The signal processing unit may include a signal conversion unit to convert the test output signal into a digital signal, and a digital signal processing unit to determine whether a waveform of the digital signal is stabilized, and to detect, after the waveform of the digital signal is stabilized, the open-type fault of the plurality of passive elements based on the stabilized waveform of the digital signal and the element characteristic information.

The digital signal processing unit may include a memory unit to store the digital signal, and a waveform distortion measuring unit to determine whether the waveform of the digital signal is stabilized based on the digital signal stored in the memory unit.

The digital signal processing unit may include a feature extracting unit to generate feature information based on the digital signal, and a faulty element detecting unit to detect the open-type fault of the plurality of passive elements based on the feature information and the element characteristic information.

The signal conversion unit may perform an RMS-to-DC conversion on the test output signal if a frequency of the test output signal is higher than a threshold frequency, and the digital signal processing unit may detect the open-type fault of the plurality of passive elements based on a result of the RMS-to-DC conversion.

The signal conversion unit may include an RMS-to-DC converter disposed on a first signal path, and to convert an RMS value of the test output signal into a DC value, a first analog-to-digital converter disposed on the first signal path, and to convert the DC value into the digital signal, a second analog-to-digital converter disposed on a second signal path, and to convert the test output signal into the digital signal, and a switch to selectively provide the first signal path or the second signal path with the test output signal received from the signal sensing unit.

The signal conversion unit may be to convert the test output signal via the first signal path if a frequency of the test output signal is higher than a threshold frequency, and may convert the test output signal via the second signal path if the frequency of the test output signal is equal to or lower than the threshold frequency.

The plurality of passive elements may include capacitors, and the signal processing unit may measure a total capacitance of the capacitors, may compare the measured capacitance with a reference capacitance that is a total capacitance of the capacitors having no open-type fault, and may determine which one of the capacitors has the open-type fault based on a difference of the measured capacitance and the reference capacitance, information about respective capacitances of the capacitors, and information about a number of the capacitors corresponding to each capacitance.

The signal sensing unit may sequentially apply test voltages having different test frequencies to the device under test, and may be to generate the test output signal by sensing the signal generated from the device under test in response to the test voltages.

The signal processing unit may detect the open-type fault of the plurality of passive elements based on a frequency characteristic that an impedance of the plurality of passive elements changes according to a frequency of a test voltage applied to the plurality of passive elements.

The signal processing unit may detect the open-type fault of the plurality of passive elements based on an error characteristic that an impedance of the plurality of passive elements changes according to a level of a test voltage applied to the plurality of passive elements.

The plurality of passive elements may include resistors, and the signal processing unit may compare a level of the test output signal with a reference level that is a level of the test output signal in a case where the resistors have no open-type fault, and may determine which one of the resistors has the open-type fault based on a difference between the level of the test output signal and the reference level, information about respective resistances of the resistors according to a level of a test voltage applied to the device under test, and information about a number of the resistors corresponding to each resistance.

The foregoing and/or other features and utilities of the present general inventive concept may also be achieved by providing a test system including a device under test including a plurality of passive elements that are connected in parallel, and testing device including a signal sensing unit to generate a test output signal by sensing a signal from the device under test, and a signal processing unit to detect an open-type fault of the plurality of passive elements by measuring an impedance of the device under test based on element characteristic information of the plurality of passive elements.

The plurality of passive elements may include a plurality of capacitors that are connected in parallel between power supply voltage lines, and the device under test may be a semiconductor module including at least one semiconductor device and the plurality of capacitors.

The plurality of passive elements may include a plurality of protection diodes that are connected in parallel between a power supply voltage line and an input/output line, and the device under test may be a semiconductor module including at least one semiconductor device having the plurality of protection diodes.

The foregoing and/or other features and utilities of the present general inventive concept may also be achieved by providing a test system, including a signal processing unit to compare element characteristics of a plurality of elements connected in parallel with a reference threshold, and to detect an open-type fault corresponding to at least one of the plurality of elements based on a result of the comparison, a number of the plurality of elements, and the element characteristics of each individual one of the plurality of elements.

The element characteristics may include at least one of voltage, current, resistance, capacitance, and impedance.

The test system may further include a signal sensing unit to generate a test output signal based on a signal output from the plurality of elements, wherein the signal processing unit measures the element characteristics of the plurality of elements by analyzing the test output signal.

The signal processing unit may detect the open-type fault by converting the test output signal into a digital signal and may determine whether the digital signal is stabilized based on whether a deviation of a waveform of the digital signal becomes less than a predetermined value.

The foregoing and/or other features and utilities of the present general inventive concept may also be achieved by providing a method of detecting an open-type fault within a device under test comprising a plurality of passive elements connected in parallel, the method including sensing a signal generated by the device under test, generating an output signal based on the sensed signal, and measuring an impedance of the device under test based on element characteristic information of the plurality of passive elements and the output signal.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
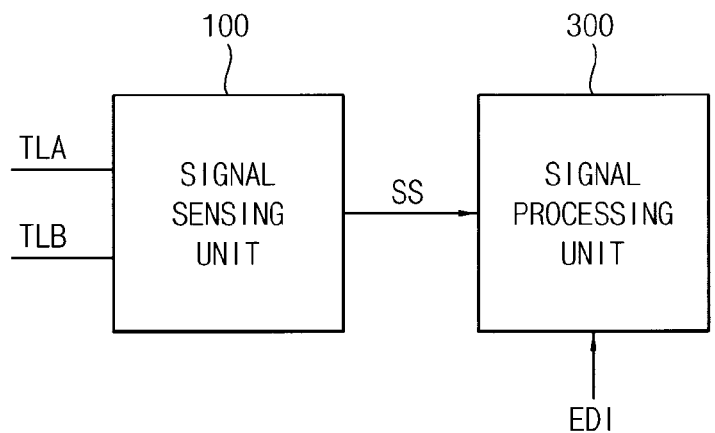
FIG. 1 is a block diagram illustrating a testing device according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a testing device according to an exemplary embodiment of the present general inventive concept.

Referring to FIG. 1, a testing device 10 includes a signal sensing unit 100 and a signal processing unit 300.

The signal sensing unit 100 generates a test output signal SS by sensing a signal output from a device under test. The device under test includes a plurality of passive elements that are connected in parallel. The testing device 10 may detect an open-type fault of at least a portion of the passive elements, which occurs when there is a break in a circuit, by measuring a total impedance of the passive elements. The signal sensing unit 100 may apply a test signal to the device under test through a test line TLA. The test signal may be a test voltage or a test current. The signal sensing unit 100 may sense a voltage signal and/or a current signal generated from the device under test in response to the test signal through a test line TLB. The signal sensing unit 100 may generate the test output signal SS by sensing the signal output from the device under test via the test line TLB. The signal sensing unit 100 may adjust an amplitude, a frequency and/or a level of the test signal to sense the signal output from the device under test according to the adjusted amplitude, frequency and/or level of the test signal. In some embodiments, the device under test may be a semiconductor module including at least one semiconductor device. The passive elements of the device under test will be described below with reference to FIGS. 10A, 10B, 11A, 11B and 11C.

The signal processing unit 300 may measure an impedance of the device under test by analyzing a waveform of the test output signal SS based on element characteristic information EDI of the passive elements included in the device under test. The signal processing unit 300 may determine whether the passive elements have the open-type fault based on the measured impedance and the element characteristic information EDI.

The element characteristic information EDI may include at least one of information about respective impedances of the passive elements, information about a number of the passive elements corresponding to each impedance, and information about changes of the impedances of the passive elements according to a level of a voltage or a current applied to the passive elements. In some embodiments, the element characteristic information EDI may be used by the testing device 10 to determine which one of the passive elements has the open-type fault. For example, the testing device 10 may compare the measured total impedance of the passive elements with a reference impedance of the passive elements having no open-type fault, and may determine which one of the passive elements has the open-type fault based on a difference between the measured impedance and the reference impedance, the information about the respective impedances of the passive elements, and the information about the number of the passive elements corresponding to each impedance. In some embodiments, the element characteristic information EDI of the passive elements may include information about non-uniformity of a response pattern according to a voltage and/or current signal applied to the passive elements, such as information about a voltage and/or current characteristic change according to a frequency of the signal applied to the passive elements, information about an impedance change according to a voltage/current level of the signal applied to the passive elements, etc.

In some embodiments, the passive elements may include a plurality of capacitors that are connected in parallel, and the element characteristic information EDI of the passive elements may include respective capacitances of the capacitors, and a number of the capacitors corresponding to each the capacitance. In other embodiments, the passive elements may include a plurality of protection diodes, and the element characteristic information EDI of the passive elements may include respective resistances of the protection diodes, and a number of the protection diodes corresponding to each resistance.

In some embodiments, as will be described below with reference to FIGS. 10A and 10B, the testing device 10 may detect the open-type fault of the capacitors that are connected in parallel in the device under test based on the element characteristic information EDI including information about a frequency characteristic of the capacitors. The information about the frequency characteristic of the capacitors may be information about a change of an effective voltage applied to the capacitors or a change of an effective current flowing through the capacitors according to the frequency of the test signal applied to the device under test. In other embodiments, the testing device 10 may detect the open-type fault of the capacitors based on the element characteristic information EDI including information about an error characteristic of the capacitors. The information about the error characteristic of the capacitors may be information about a change of the capacitances of the capacitors according to a level of a voltage applied to the capacitors. In general, a capacitor having a small dielectric constant may have an apparent error characteristic.

In other embodiments, as will be described below with reference to FIGS. 11A, 11B and 11C, the testing device 10 may detect the open-type fault of an internal connection line included in at least one input/output stage of at least one semiconductor device based on the element characteristic information EDI of the passive elements included in the at least one input/output stage. For example, the element characteristic information EDI may include information about an impedance change characteristic of protection diodes included in the at least one input/output stage according to a level of a voltage applied to the protection diodes. Generally, an impedance of the protection diodes may change according to the level of the voltage applied to the protection diodes, and the impedance change characteristic of the protection diodes may vary according to types of the protection diodes. By using the impedance change characteristic as the element characteristic information EDI, the testing device 10 may accurately measure the impedance of the device under test. Accordingly, the accuracy of the faulty element detection by the testing device 10, or the accuracy in detecting the open-type fault of the internal connection line may be improved by using the element characteristic information EDI.

In some embodiments, the signal processing unit 300 may detect the open-type fault of the passive elements based on the frequency characteristic that the impedance of the passive elements varies according to the frequency of the test voltage applied to the passive elements. In other embodiments, the signal processing unit 300 may detect the open-type fault of the passive elements based on the error characteristic that the impedance of the passive elements varies according to the level of the test voltage applied to the passive elements.

As described above, the testing device 10 according to an exemplary embodiment of the present general inventive concept may measure the impedance of the passive elements that are connected in parallel using the element characteristic information EDI of the passive elements. Thus, the testing device 10 may accurately detect the open-type fault of the passive elements included in the device under test, such as the semiconductor module on which the semiconductor devices are mounted.

Figure 2:
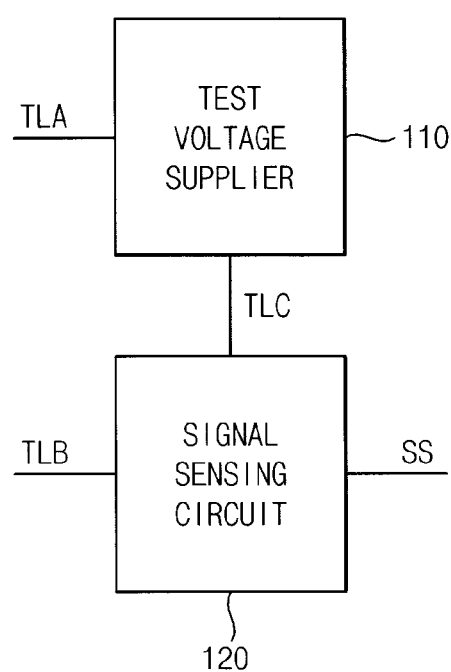
FIG. 2 is a block diagram illustrating an example of a signal sensing unit illustrated in FIG. 1.

FIG. 2 is a block diagram illustrating an example of the signal sensing unit 100 illustrated in FIG. 1.

Referring to FIG. 2, the signal sensing unit 100 includes a test voltage supplier 110 and a signal sensing circuit 120.

The test voltage supplier 110 may be coupled between test lines TLA and TLC, and may apply a test voltage to a device under test through the test line TLA. The device under test may generate a voltage or current signal in response to the test voltage received from the test voltage supplier 110. The voltage or current signal may vary according to an electrical characteristic of passive elements included in the device under test. The signal sensing circuit 120 may sense the voltage or current signal from the device under test through a test line TLB, and may generate a test output signal SS based on the sensed signal.

In some embodiments, when the testing device 10 of FIG. 1 detects an open-type fault of a plurality of capacitors that are connected in parallel, the test voltage may be an alternating current (AC) voltage having a test frequency and a test level. The test frequency and the test level may be determined according to a capacitance of a capacitor on which the open-type fault detection is performed. For example, the test frequency may be determined such that a measured capacitance of the capacitor to be tested has a large difference with respect to a reference capacitance in a case where the capacitor has no open-type fault. In other embodiments, when the testing device 10 of FIG. 1 detects an open-type fault of a plurality of resistive elements (e.g., resistors, protection diodes, etc.) that are connected in parallel, the test voltage may be a direct current (DC) voltage.

Figure 3A:
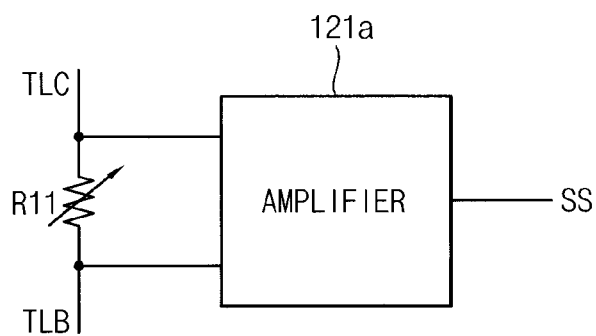
FIGS. 3A and 3B are block diagrams illustrating examples of a signal sensing circuit illustrated in FIG. 2.
Figure 3B:
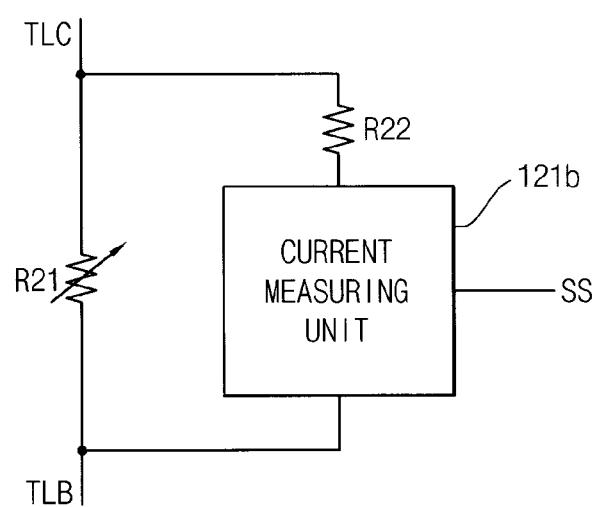

FIGS. 3A and 3B are block diagrams illustrating examples of the signal sensing circuit 120 illustrated in FIG. 2.

Referring to FIG. 3A, a signal sensing circuit 120a includes a variable resistor R11 and an amplifier 121a. The amplifier 121a may generate a test output signal SS based on a voltage between two ends of the variable resistor R11. To generate the test output signal SS having a range that is able to be perceived and processed by a signal processing unit 300 illustrated in FIG. 1, the amplifier 121a may amplify the voltage of the variable resistor R11 by an amplification gain such that the range of the test output signal SS may correspond to an input range of the signal processing unit 300. In this case, the signal processing unit 300 may use the amplification gain to measure and analyze the test output signal SS. A resistance of the variable resistor R11 may be adjusted such that the voltage of the variable resistor R11 may have a small error in sensing a total capacitance of a plurality of capacitors included in a device under test. That is, the resistance of the variable resistor R11 may be adjusted based on the capacitance of the device under test.

Referring to FIG. 3B, a signal sensing circuit 120b includes a variable resistor R21, a scale resistor R22 and a current measuring unit 121b. Since an internal resistor of the current measuring unit 121b is generally negligible, an amount of a current flowing through the current measuring unit 121b may be determined based on a current flowing between test lines TLB and TLC and a ratio of a resistance of the variable resistor R21 to a resistance of the scale resistor R22. The current measuring unit 121b may generate a test output signal SS by sensing the current flowing through the current measuring unit 121b. The resistance of the scale resistor R22 may be determined such that the current measuring unit 121b may generate the test output signal SS having a range that is able to be perceived and processed by a signal processing unit 300 illustrated in FIG. 1. The resistance of the variable resistor R21 may be adjusted such that the voltage of the variable resistor R21 may have a small error in sensing a total resistance of a plurality of resistors included in a device under test. That is, the resistance of the variable resistor R21 may be adjusted based on the resistance of the device under test.

Figure 4A:
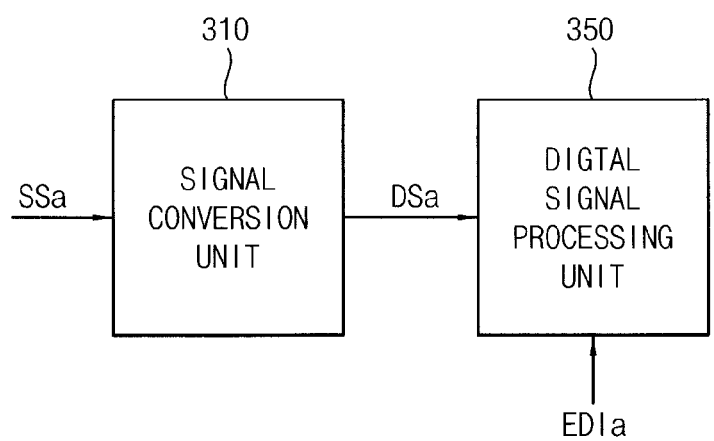
FIGS. 4A and 4B are block diagram illustrating examples of a signal processing unit illustrated in FIG. 1.
Figure 4B:
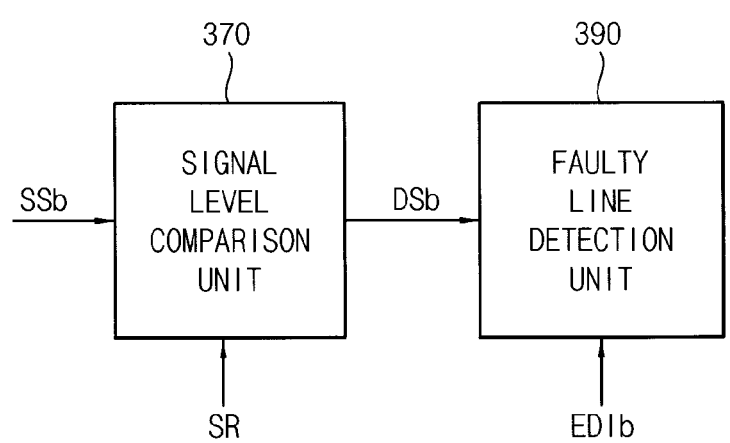

FIGS. 4A and 4B are block diagram illustrating examples of the signal processing unit 300 illustrated in FIG. 1.

Referring to FIG. 4A, a signal processing unit 300a includes a signal conversion unit 310 and a digital signal processing unit 350.

The signal conversion unit 310 may convert a test output signal SSa into a digital signal DSa. The digital signal processing unit 350 may determine whether a waveform of the digital signal is stabilized. For example, the digital signal processing unit 350 may determine whether a deviation of the waveform of the digital signal DSa becomes less than a threshold or predetermined value. Here, the deviation of the waveform may be a difference between peak-to-peak values in adjacent cycles of the AC waveform. That is, the digital signal processing unit 350 may decide the waveform of the digital signal DSa to be stabilized if the difference between peak-to-peak values in adjacent cycles of the AC waveform of the digital signal DSa becomes less than the threshold value. After the waveform of the digital signal DSa is stabilized, or after the deviation of the digital signal DSa becomes less than the threshold value, the digital signal processing unit 350 may detect an open-type fault of a plurality of passive elements based on the stabilized waveform of the digital signal DSa and element characteristic information EDIa of the passive elements.

Figure 10A:
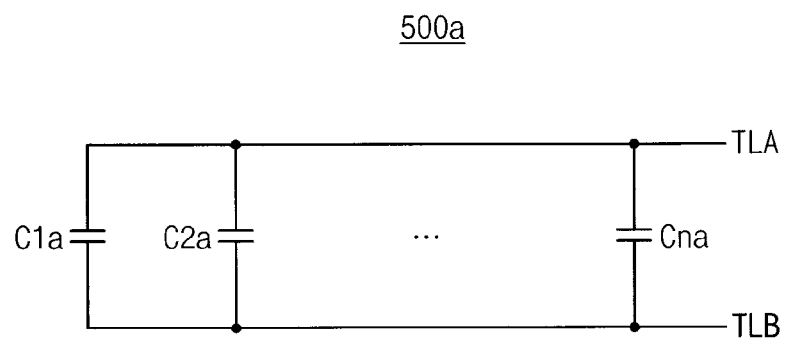
FIGS. 10A and 10B are diagrams illustrating examples of a device under test illustrated in FIG. 7.
Figure 10B:
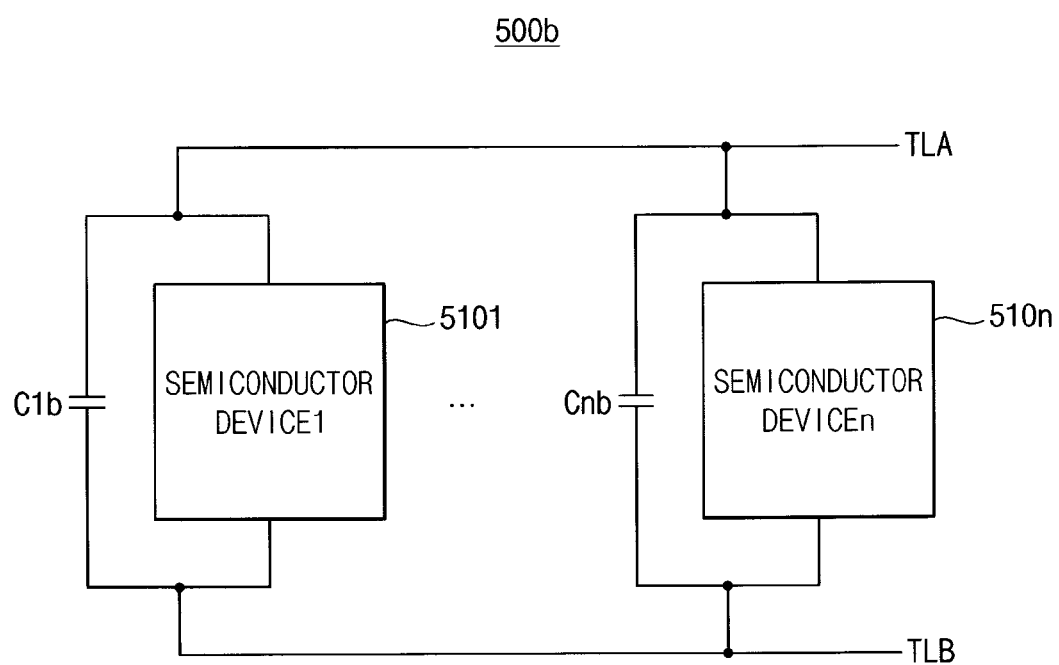

As illustrated in FIGS. 10A and 10B, the signal processing unit 300a may be used to detect the open-type fault of a plurality of capacitors included in a device under test. In this case, an AC test voltage may be applied to the device under test, and an amplitude or a peak-to-peak value of the digital signal DSa may change over time until a circuit formed by the capacitors and a signal sensing unit 100 of FIG. 1 is almost in a steady state, or until the waveform of the digital signal DSa is stabilized. If the capacitance of the device under test is measured based on the digital signal DSa of which the waveform is not stabilized, the open-type fault of the capacitors may not be accurately detected because of the deviation of the waveform of the test output signal SSa. Thus, to accurately measure the capacitance of the device under test, the digital signal processing unit 350 may determine whether the waveform of the digital signal DSa is stabilized such that the deviation of the waveform of the digital signal DSa over time is less than the threshold value.

Referring to FIG. 4B, a signal processing unit 300b includes a signal level comparison unit 370 and a faulty line detection unit 390.

The signal level comparison unit 370 may compare a level of a test output signal SSb with a level of a reference signal SR, and may generate a digital signal DSb corresponding to a difference between the level of the test output signal SSb and the level of the reference signal SR. The reference signal SR may be an expected test output signal when resistive elements that are connected in parallel do not have a fault or normally operate. Based on the digital signal DSb and element characteristic information EDIb of protection diodes of at least one semiconductor device included in the device under test, the faulty line detection unit 390 may detect either an open-type fault of an internal connection line to couple input/output stages of the at least one semiconductor device or an open-type fault of the protection diodes.

Figure 11A:
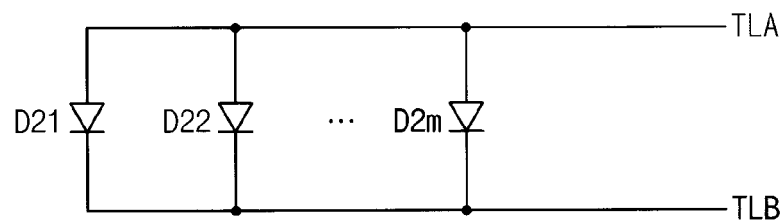
FIGS. 11A, 11B and 11C are diagrams illustrating other examples of a device under test illustrated in FIG. 7.
Figure 11B:
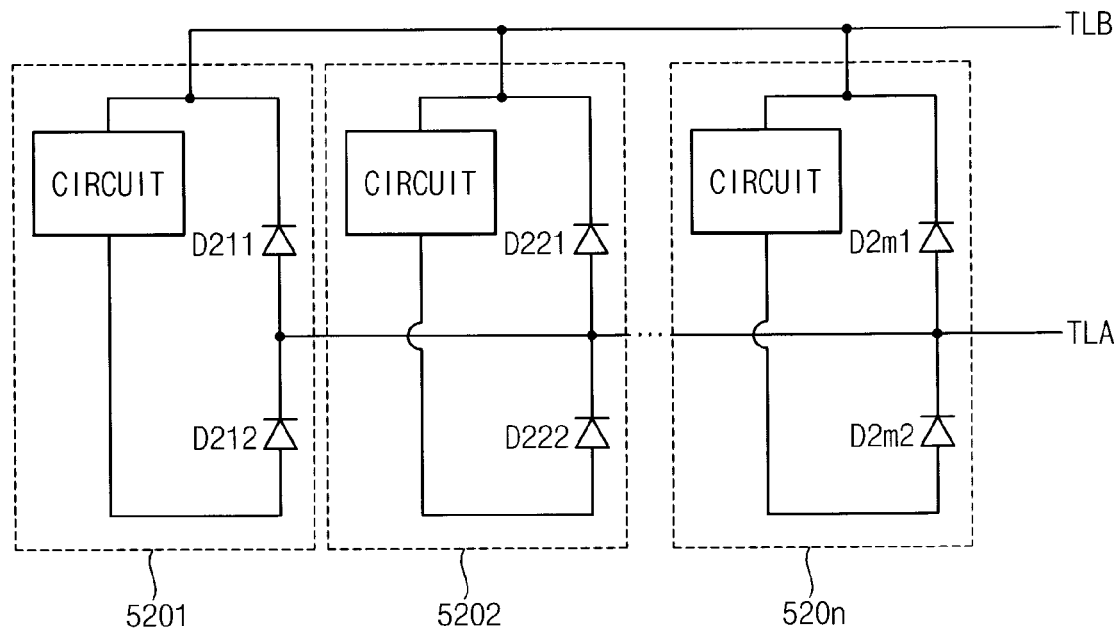
Figure 11C:
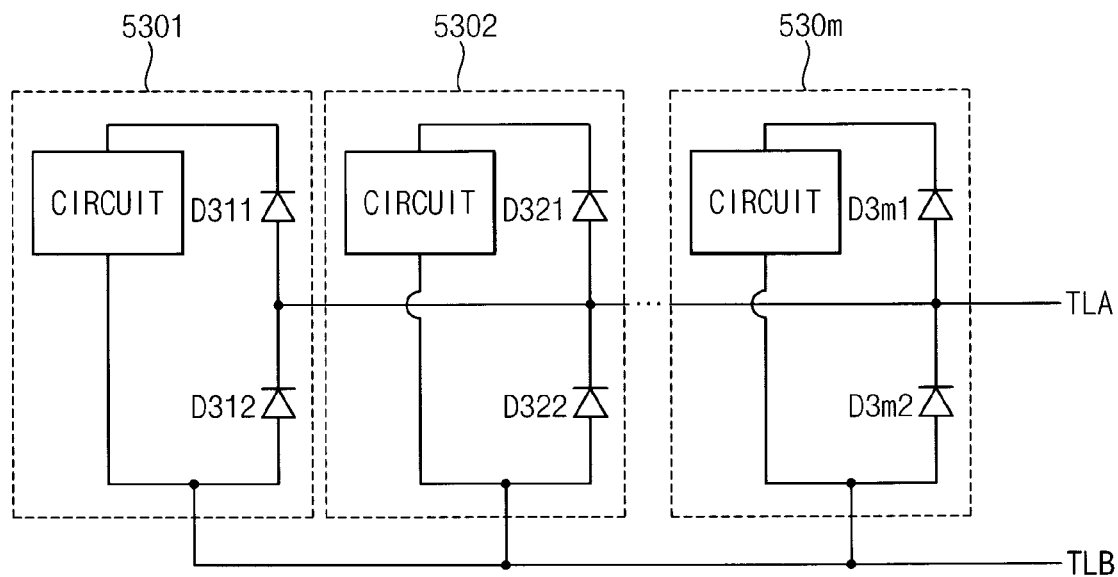

As illustrated in FIGS. 11A, 11B and 11C, the signal processing unit 300b may be used to detect the open-type fault of the protection diodes included in the device under test. In this case, a DC test voltage may be applied to the device under test, and the test output signal SSb may correspond to a level of a current flowing through test lines TLA and TLB in a circuit formed by the protection diodes and a signal sensing unit 100 illustrated in FIG. 1. Since an impedance of a diode generally changes according to an applied voltage, the faulty line detection unit 390 may detect the open-type fault of the protection diodes by analyzing the digital signal DSb, which is a result of the comparison, using an electrical characteristic of the protection diodes, or using information about a change in impedance according to the applied voltage.

Figure 5A:
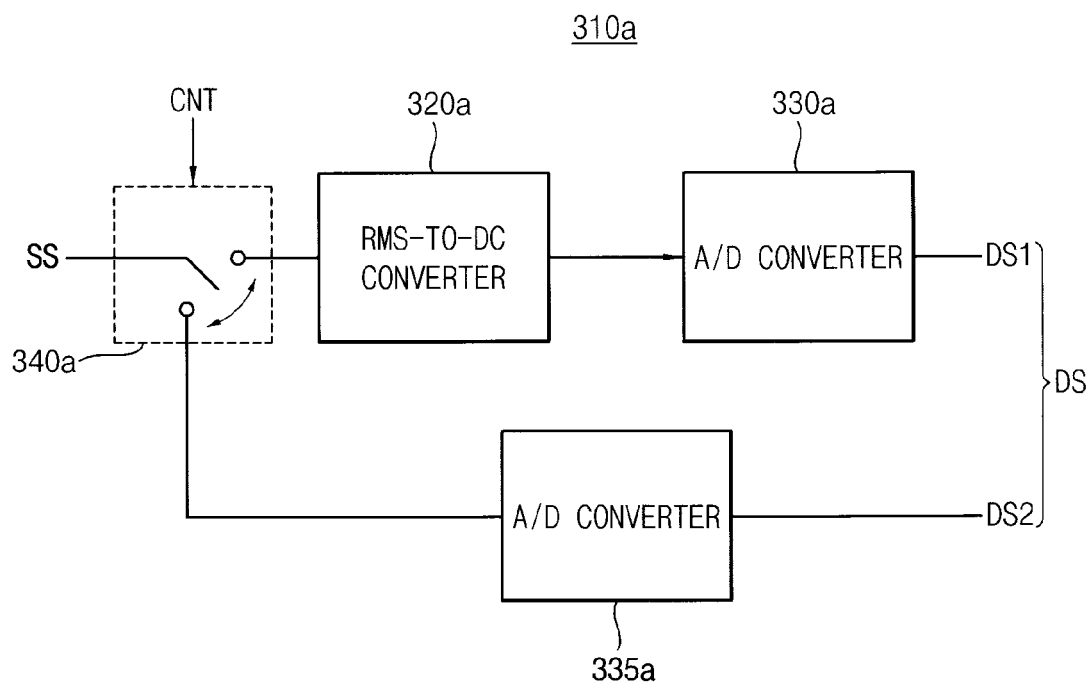
FIGS. 5A and 5B are block diagrams illustrating examples of a signal conversion unit illustrated in FIG. 4A.
Figure 5B:
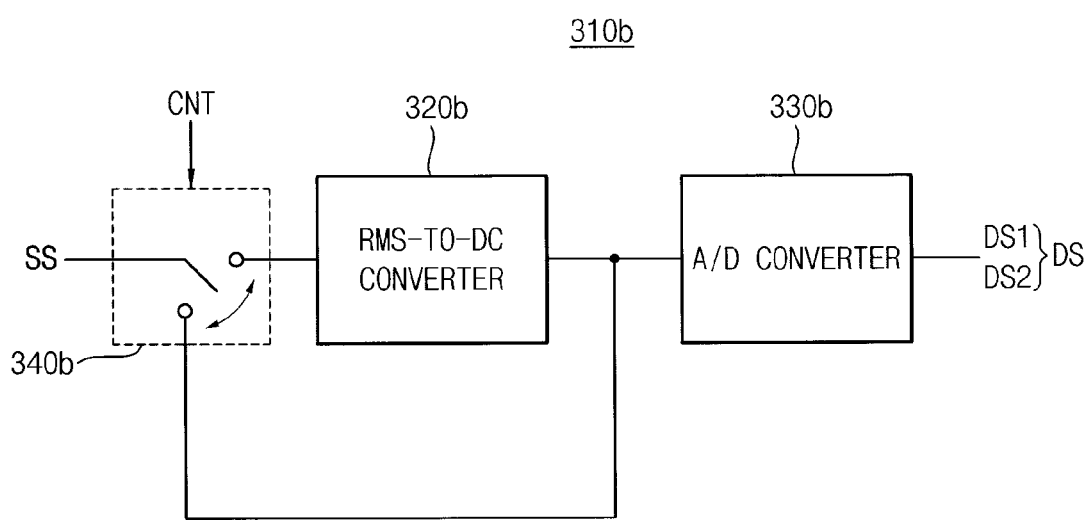

FIGS. 5A and 5B are block diagrams illustrating examples of a signal conversion unit 310 illustrated in FIG. 4A.

Referring to FIG. 5A, a signal conversion unit 310a includes a root mean square to direct current (RMS-to-DC) converter 320a, a first analog-to-digital converter 330a, a second analog-to-digital converter 335a and a switch 340a.

The RMS-to-DC converter 320a may be disposed on a first signal path, and may convert an RMS of a test output signal SS into a DC signal. The first analog-to-digital converter 330a may be disposed on the first signal path, and may convert the DC signal into a first digital signal DS1. The second analog-to-digital converter 335a may be disposed on a second signal path, and may convert the test output signal SS into a second digital signal DS2. The switch 340a may selectively apply the test output signal SS to the first signal path or the second signal path in response to a control signal CNT. The control signal CNT may selectively have a first logic level or a second logic level according to a frequency of the test output signal SS. The frequency of the test output signal SS may be substantially the same as a test frequency of a test voltage applied to a device under test. For example, when the frequency of the test output signal SS (or the test frequency of the test voltage) is higher than a threshold frequency, the control signal CNT may have the first logic level, and the test output signal SS may be applied to the first signal path. Thus, the RMS-to-DC converter 320a and the first analog-to-digital converter 330a may output the first digital signal DS1 on which an RMS-to-DC conversion is performed. When the frequency of the test output signal SS is equal to or less than the threshold frequency, the control signal CNT may have the second logic level, and the test output signal SS may be applied to the second signal path. In some embodiments, the control signal CNT may be generated by a signal processing unit 300 illustrated in FIG. 1. In other embodiments, the control signal CNT may be generated by an external circuit.

Referring again to FIGS. 1 and 5A, when the test frequency of the test voltage applied to the device under test is higher than the threshold frequency, a signal processing unit 300 may generate the first digital signal DS1 on which the RMS-to-DC conversion is performed. When the test frequency of the test voltage signal is equal to or less than the threshold frequency, the signal processing unit 300 may generate the second digital signal DS2 into which the test output signal SS is directly converted without the RMS-to-DC conversion. Thus, an impedance of a plurality of passive elements may be calculated by selectively using the first digital signal DS1 or the second digital signal DS2. That is, the signal conversion unit 310a may convert the test output signal SS via the first signal path when the frequency of the test output signal SS is higher than the threshold frequency, and may convert the test output signal SS via the second signal path when the frequency of the test output signal SS is equal to or less than the threshold frequency. In some embodiments, the threshold frequency may be about half a sampling frequency of the first analog-to-digital converter 330a and/or the second analog-to-digital converter 335a.

As described above, since the signal conversion unit 310a includes the first and second signal paths to convert the test output signal SS, the signal conversion unit 310a may selectively generate the first digital signal DS1 corresponding to an RMS value of the test output signal SS or the second digital signal DS2 corresponding to a sampled value of the test output signal SS according to the frequency of the test output signal SS, or the test frequency of the test voltage. The first and second digital signals DS1 and DS2 may be stored in a memory unit 351 illustrated in FIG. 6.

Referring to FIG. 5B, a signal conversion unit 310b includes an RMS-to-DC converter 320b, an analog-to-digital converter 330b and a switch 340b.

The signal conversion unit 310b may control the switch 340b in response to the control signal CNT such that a test output signal SS selectively passes through the RMS-to-DC converter 320b according to a frequency of the test output signal SS. In some embodiments, the signal conversion unit 310b may not include the switch 340b, and the test output signal SS may be converted by both of the RMS-to-DC converter 320b and the analog-to-digital converter 330b.

The signal conversion unit 310b of FIG. 5B may be substantially similar to a signal conversion unit 310a of FIG. 5A except that the analog-to-digital converter 330b is shared by the first and second signal paths.

Figure 6:
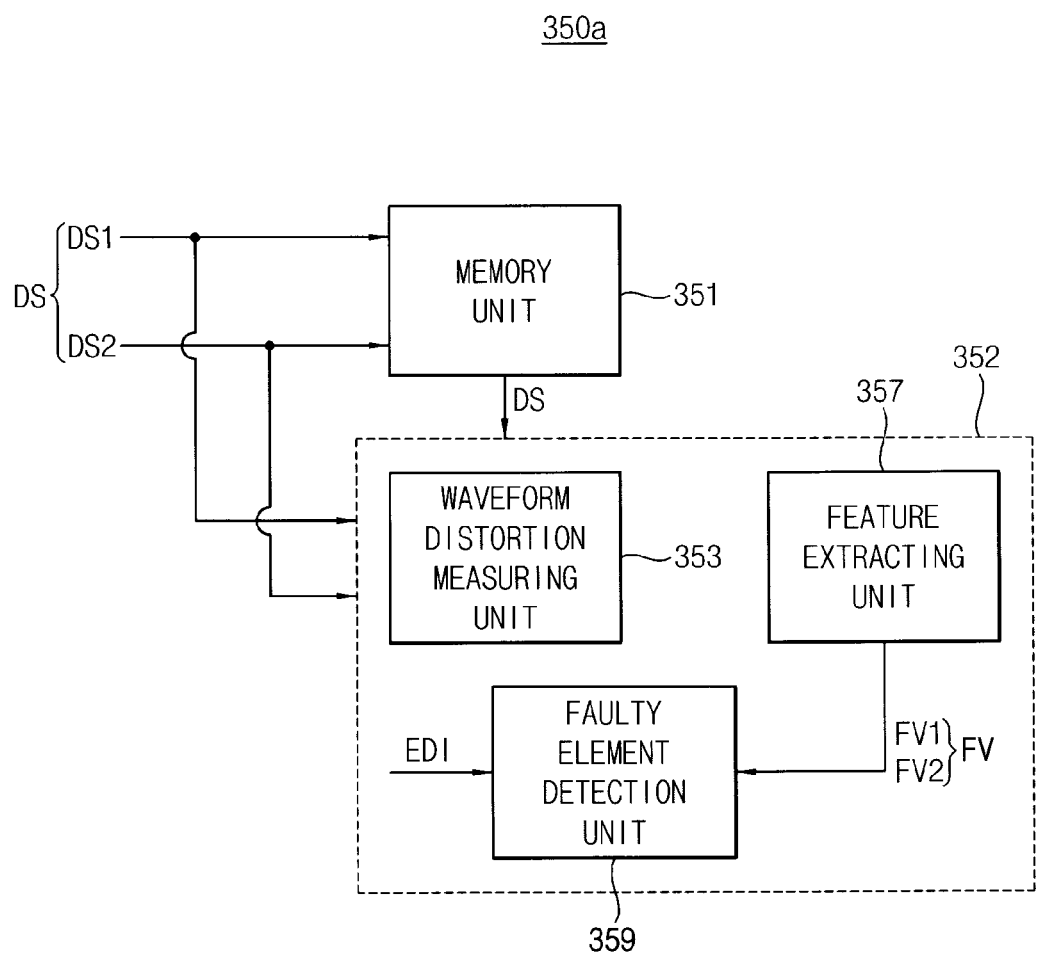
FIG. 6 is a block diagram illustrating an example of a digital signal processing unit illustrated in FIG. 4A.

FIG. 6 is a block diagram illustrating an example of a digital signal processing unit 350 illustrated in FIG. 4A.

Referring to FIG. 6, a digital signal processing unit 350a includes a memory unit 351 and a micro-processing unit 352.

The memory unit 351 may store a digital signal DS. The memory unit 351 may include a memory device, such as a dynamic random access memory (DRAM), a static random access memory (SRAM), a flash memory, etc., but is not limited thereto.

The micro-processing unit 352 may include a waveform distortion measuring unit 353. The waveform distortion measuring unit 353 may receive the digital signal DS from the memory unit 351 or directly from the signal conversion unit 310 of FIG. 4A, and may determine whether a waveform of the digital signal DS is stabilized by analyzing the waveform of the digital signal DS. For example, the waveform distortion measuring unit 353 may measure a degree of distortion in the waveform of the digital signal DS to determine whether the waveform of the digital signal DS is stabilized. The waveform distortion measuring unit 353 may decide the waveform of the digital signal DS to be stabilized if a deviation of the waveform of the digital signal DSa becomes less than a threshold value. After the waveform of the digital signal DS is stabilized, a signal processing unit 300 of FIG. 1 may detect an open-type fault of passive elements based on the digital signal DS and element characteristic information EDI.

In some embodiments, the micro-processing unit 352 may further include a feature extracting unit 357 and a faulty element detection unit 359.

The feature extracting unit 357 may extract feature information FV from the digital signal DS. In some embodiments, a test output signal SS is an AC signal, and the feature information FV may include at least one of an amplitude of the AC signal, a peak-to-peak value of the AC signal and an RMS value of the AC signal. For example, in a case where the digital signal DS is generated through a first signal path illustrated in FIG. 4A, or in a case where the digital signal DS is a first digital signal DS1 including RMS values of the test output signal SS, the feature information FV may include the RMS values of the test output signal SS. In a case where the digital signal DS is generated through a second signal path illustrated in FIG. 4A, or in a case where the digital signal DS is a second digital signal DS2 including sampled values of the test output signal SS, the feature information FV may include amplitudes or peak-to-peak values of the test output signal SS.

The faulty element detection unit 359 may detect the open-type fault of the passive elements based on the feature information FV and the element characteristic information EDI. For example, the element characteristic information EDI of the passive elements may include information about non-uniformity of a response pattern according to a voltage/current signal applied to the passive elements, such as information about a voltage/current characteristic change according to a frequency of the signal applied to the passive elements, information about an impedance change according to a voltage/current level of the signal applied to the passive elements, etc. In some embodiments, the passive elements may include a plurality of capacitors, and the element characteristic information EDI may include information about respective capacitances of the capacitors, and information about the number of the capacitors corresponding to each capacitance.

In some embodiments, the faulty element detection unit 359 may detect the open-type fault of the passive elements based on a frequency characteristic that an impedance of the passive elements changes according to a frequency of a test voltage applied to the passive elements. In other embodiments, the faulty element detection unit 359 may detect the open-type fault of the passive elements based on an error characteristic that the impedance of the passive elements changes according to a level of the test voltage applied to the passive elements. For example, in a case where the passive elements are a plurality of capacitors having small dielectric constants, errors of capacitances of the capacitors may increase according to the level of the test voltage applied to the capacitors, and the element characteristic information EDI may include the error characteristic that the errors of the capacitances increase according to the level of the test voltage.

Referring again to FIGS. 1, 5A and 6, a signal sensing unit 100 may apply a test voltage to a device under test including a plurality of capacitors that are connected in parallel. The test voltage may have a test frequency determined according to information about respective capacitances of the capacitors. The signal sensing unit 100 may generate a test output signal SS by sensing a voltage signal generated by the capacitors in response to the test voltage. A signal processing unit 300 may convert the test output signal SS into a first digital signal DS1 by performing a RMS-to-DC conversion if the test frequency is higher than a threshold frequency, and may generate first feature information FV1 based on the first digital signal DS1. The signal processing unit 300 may convert the test output signal SS into a second digital signal DS2 without performing the RMS-to-DC conversion if the test frequency is equal to or less than the threshold frequency. The signal processing unit 300 may generate second feature information FV2 based on the second digital signal DS2. For example, the first feature information FV1 may include RMS values of the test output signal SS, and the second feature information FV2 may include amplitudes or peak-to-peak values of the test output signal SS. The signal processing unit 300 may detect the open-type fault of the capacitors by analyzing the first feature information FV1 and/or the second feature information FV2 using information about respective capacitances of the capacitors and information about the number of the capacitors corresponding to each capacitance.

Therefore, the testing device of FIG. 1 may measure a capacitance of passive elements that are connected in parallel by applying an AC test voltage, and thus may accurately detect, based on element characteristic information of the passive elements, an open-type fault of the passive elements included in a device under test, such as a semiconductor module on which semiconductor devices are mounted.

Figure 7:
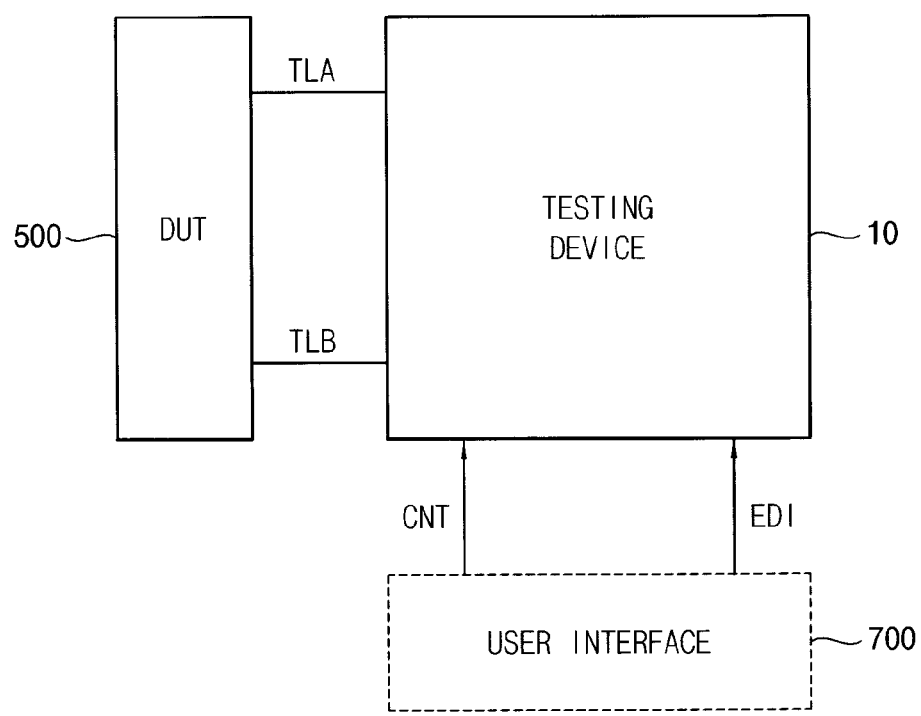
FIG. 7 is a block diagram illustrating a test system according to an exemplary embodiment of the present general inventive concept.

FIG. 7 is a block diagram illustrating a test system according to an exemplary embodiment of the present general inventive concept.

Referring to FIGS. 1 and 7, a test system 30 includes a device under test 500 and the testing device 10.

The device under test 500 may include a plurality of passive elements that are connected in parallel. In some embodiments, the passive elements may include capacitors, protection diodes, etc., but are not limited thereto. Examples of the passive elements will be described below with reference to FIGS. 10A, 10B, 11A, 11B and 11C.

The testing device 10 may detect an open-type fault based on element characteristic information EDI of the passive elements. The testing device 10 may include a signal sensing unit 100 and a signal processing unit 300. The signal sensing unit 100 may generate a test output signal SS by sensing a signal from the device under test 500. The signal processing unit 300 may detect the open-type fault of the passive elements by measuring an impedance of the device under test 500 based on the element characteristic information EDI of the passive elements.

In some embodiments, the test system 30 may further include a user interface 700. The test system 30 may control a signal conversion path of the test output signal SS in response to a control signal CNT provided from the user interface 700 according to a frequency of the test output signal SS. In this case, the testing device 10 may include one of the signal conversion unit 310a of FIG. 5A or the signal conversion unit 310b of FIG. 5B.

The user interface 700 may include an input device and an output device to provide a result to a user. In some embodiments, the user interface 700 may further include a memory device to store the element characteristic information EDI. The user interface 700 may provide the element characteristic information EDI and the control signal CNT via the input device.

The test system 30 according to some exemplary embodiments may measure a capacitance of parallel-connected capacitors by applying an AC test voltage having a predetermined test frequency, and may analyze the measured capacitance using the element characteristic information of the capacitors. For example, the test frequency of the AC test voltage may be determined such that the measured capacitance of the capacitors has a large difference with respect to a reference capacitance in a case where the capacitors have no open-type fault. The test system 30 according to other exemplary embodiments may measure a resistance of parallel-connected protection diodes by applying a DC test voltage, and may analyze the measured resistance using the element characteristic information of the protection diodes. The test system 30 may accurately detect the open-type fault by accurately measuring the capacitance or the resistance.

Figure 8:
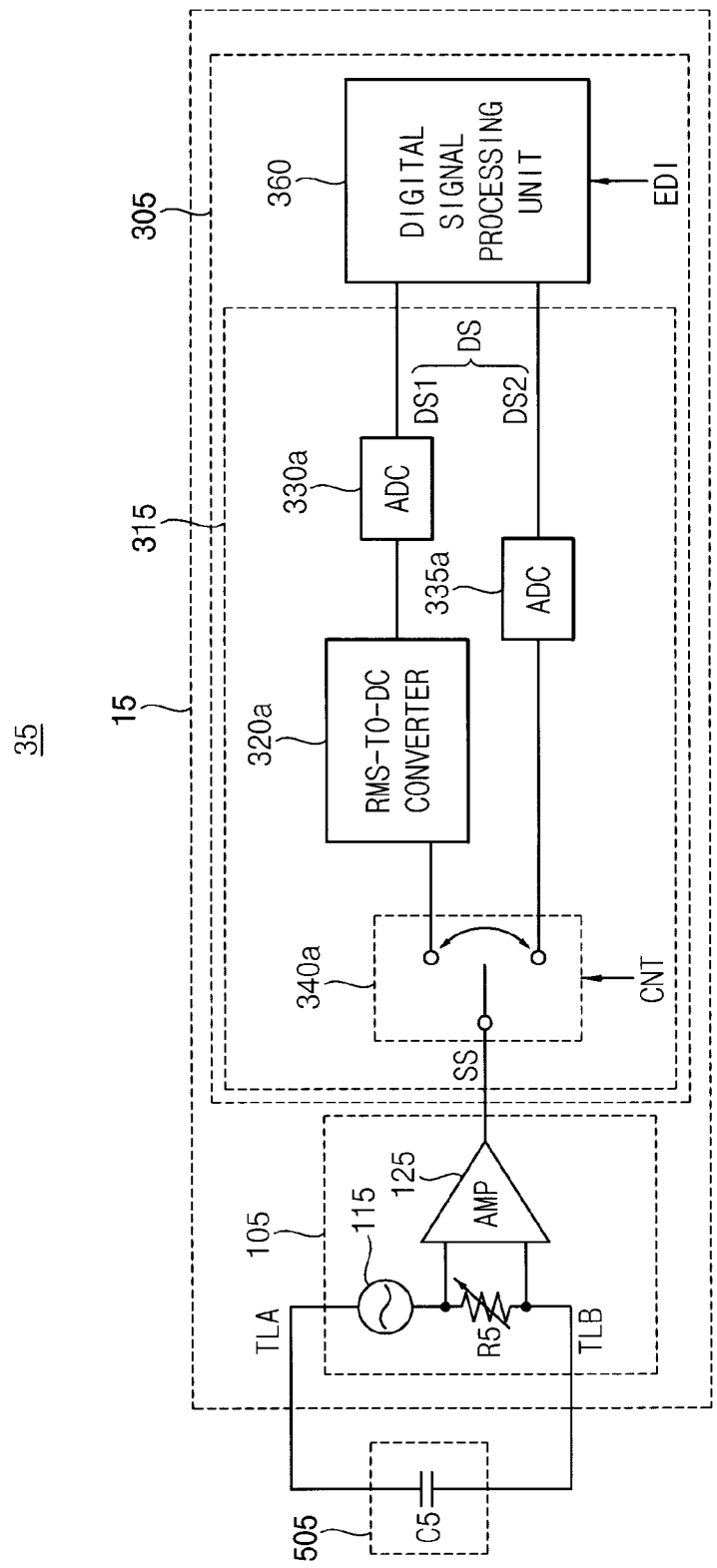
FIG. 8 is a diagram illustrating an example of a test system illustrated in FIG. 7.

FIG. 8 is a diagram illustrating an example of the test system 30 illustrated in FIG. 7.

Referring to FIG. 8, a test system 35 includes a device under test 505 and a testing device 15. The testing device 15 includes a signal sensing unit 105 and a signal processing unit 305. The signal processing unit 305 includes a signal conversion unit 315 and a digital signal processing unit 360.

In some embodiments, the device under test 505 may include a capacitor C5. The capacitor C5 may be formed by a plurality of capacitors that are connected in parallel, each of which may have an open-type fault. For the sake of convenience, one capacitor C5 having a capacitance corresponding to the total capacitance of the plurality of capacitors is illustrated in FIG. 8.

The signal sensing unit 105 may include a test voltage supplier 115, a variable resistor R5 and an amplifier 125. The test voltage supplier 115 may provide an AC test voltage of a sine-wave form through a test line TLA. The variable resistor R5 may form an RC circuit with the capacitor C5. A voltage between both ends of the variable resistor R5 may change according to a frequency of the AC test voltage provided from the test voltage supplier 115 to the RC circuit.

The signal sensing unit 105 of FIG. 8 may be substantially similar to a signal sensing unit 100 of FIG. 2. The signal conversion unit 315 of FIG. 8 may be substantially similar to the signal conversion unit 310a of FIG. 5A. The digital signal processing unit 360 of FIG. 8 may be substantially similar to a digital signal processing unit 350a of FIG. 6.

Figure 9A:
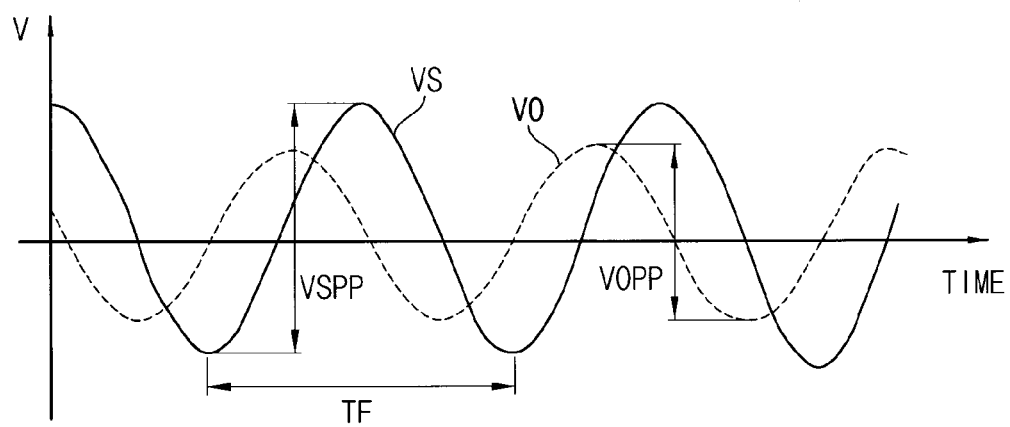
FIGS. 9A and 9B are waveform diagrams illustrating examples of a signal measured by a test system of FIG. 8.
Figure 9B:
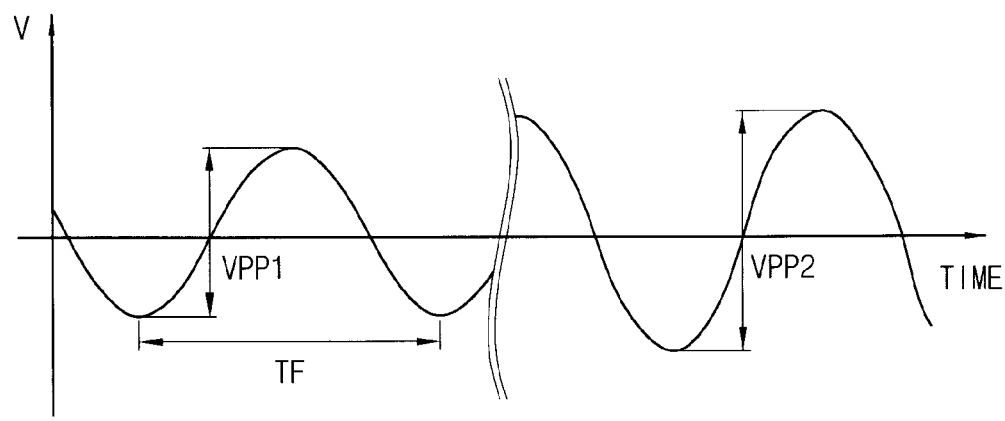

FIGS. 9A and 9B are waveform diagrams illustrating examples of a signal measured by the test system 35 of FIG. 8. In FIGS. 9A and 9B, a horizontal axis represents time, and a vertical axis represents a voltage of the measured signal.

Referring to FIGS. 8 and 9A, the test voltage generator 115 may apply an AC test voltage VS to an RC circuit formed by a capacitor C5 and a variable resistor R5. A peak-to-peak value VOPP of a sensed voltage VO between both ends of the variable resistor R5 may depend on a frequency of the AC test voltage VS, a capacitance of the capacitor C5 and a resistance of the variable resistor R5. The capacitance of the capacitor C5 may be calculated by Equation 1 using the peak-to-peak value VOPP of the sensed voltage VO.

$$C5 = \frac{1}{2\pi fR5} \sqrt{\left(\frac{VSPP}{VOPP}\right)^2 - 1}, \qquad \text{[Equation 1]}$$

where VSPP represents a peak-to-peak value of the AC test voltage VS, f represents a frequency of the AC test voltage VS, which is a multiplicative inverse for a period TF of the AC test voltage VS, R5 represents the resistance of the variable resistor R5, and C5 represents the measured capacitance of the device under test 505. Alternatively, the measured capacitance of the capacitor C5 may be calculated using RMS values of the AC test voltage VS and the sensed voltage VO instead of the peak-to-peak values of the AC test voltage VS and the sensed voltage VO.

FIG. 9B illustrates an example where peak-to-peak values or amplitudes of a sensed voltage VO change over time. For the sake of convenience, a deviation of the peak-to-peak values, or a difference between two peak-to-peak values VPP1 and VPP2 may be exaggerated in FIG. 9B. Referring to FIGS. 8 and 9B, a first peak-to-peak value VPP1 of the sensed voltage VO in an initial period may be lower than a second peak-to-peak value VPP2 of the sensed voltage VO in a period after a predetermined time elapses from the initial period. If the deviation of the two peak-to-peak values VPP1 and VPP2 measured at two adjacent cycles is equal to or lower than a threshold value, it may be determined that a waveform of the sensed voltage VO is stabilized. Although it is described above that a waveform stabilization determination is performed using the sensed voltage VO, in some embodiments, a digital signal processing unit 360 may perform the waveform stabilization determination using a test output signal SS generated by an amplifier 125.

FIGS. 10A and 10B are diagrams illustrating examples of the device under test 500 illustrated in FIG. 7.

Referring to FIG. 10A, a device under test 500a may include a plurality of capacitors C1a, C2a and Can that are connected in parallel. The plurality of capacitors C1a, C2a and Cna may be decoupling capacitors coupled between power supply voltage lines TLA and TLB in a memory module. In some embodiments, each capacitor C1a, C2a and Cna may have one of various capacitances, such as about 3.3 pF, about 2.2 nF, about 22 nF, about 100 nF, about 220 nF, about 1 uF, about 4.7 uF, about 10 uF, etc. The numbers of capacitors having different capacitances may be the same or different. That is, the number of capacitors having a capacitance may be the same or different from the number of capacitors having another capacitance. Here, information about the numbers of the capacitors having respective capacitances may be referred to as element number information, and information about the respective capacitances may be referred to as element capacitance information. The element number information and the element capacitance information may be included in element characteristic information EDI described above.

Referring to FIGS. 1 and 10A, the signal processing unit 300 may compare a measured total capacitance of the capacitors C1a, C2a and Cna with a reference capacitance that is an expected total capacitance in a case where the open-type fault does not occur. The signal processing unit 300 may detect the open-type fault of the capacitors C1a, C2a and Cna based on a result of the comparison, the element number information and the element capacitance information. A capacitance difference between the reference capacitance and the measured capacitance may depend on the number of the capacitors having the open-type fault and the capacitances of the capacitors having the open-type fault. Thus, the signal processing unit 300 may detect which one of the capacitors C1a, C2a and Cna has the open-type fault based on the capacitance difference, the element number information and the element capacitance information.

In some embodiments, since the capacitance difference may be within an error of measurement, a test frequency of a test voltage may be adjusted according to the respective capacitances of the capacitors C1a, C2a and Cna. For example, the test frequency of the test voltage may be determined such that the measured capacitance has a large difference with respect to the reference capacitance in a case where the capacitors C1a, C2a and Cna have no open-type fault. The test frequency to detect the open-type fault of a capacitor having a capacitance may be different from the test frequency to detect the open-type fault of a capacitor having another capacitance. Thus, a signal sensing unit 100 may sequentially apply test voltages having different test frequencies to the device under test to detect the open-type fault of the capacitors C1a, C2a and Cna having different capacitances. The signal sensing unit 100 may sense a voltage signal generated by the capacitors C1a, C2a and Cna included in the device under test. A signal processing unit 300 may calculate a total capacitance of the capacitors C1a, C2a and Cna based on the sensed voltage signal, an impedance of the signal sensing unit 100, a voltage level of the test voltage and a frequency of the test voltage.

Referring to FIGS. 1 and 10B, a device under test 500b may be a semiconductor module including at least one semiconductor device 5101 through 510n, and a plurality of capacitors C1b through Cnb that are connected in parallel between power supply voltage lines TLA and TLB.

In some embodiments, the device under test 500b may be a memory module, such as a dual in-line memory module (DIMM), a single in-line memory module (SIMM), etc., but is not limited thereto The memory module may include a plurality of semiconductor memory devices 5101 through 510n. The semiconductor memory devices 5101 and 510n may be coupled to data lines, respectively. Further, the semiconductor memory devices 5101 through 510n may be coupled to command/address lines in a tree topology. The capacitors C1b through Cnb may be decoupling capacitors coupled between the power supply voltage lines TLA and TLB of the memory module. For example, each capacitor C1b through Cnb may have one of various capacitances, such as about 3.3 pF, about 2.2 nF, about 22 nF, about 100 nF, about 220 nF, about 1 uF, about 4.7 uF, about 10 uF, etc.

In a case where one passive element has a short-type fault among a plurality of parallel-connected passive elements formed on the memory module, the shorted passive element has a low impedance, and a total impedance of the passive elements may mainly depend on the impedance of the shorted passive element. Thus, since the total impedance of the passive elements is greatly changed, the short-type fault may be relatively easily detected. That is, a testing device to detect the short-type fault of the parallel-connected passive elements need not have high accuracy. For example, in a case where parallel-connected resistors have a total resistance of the order of tens kΩ, the total resistance may range from the order of tens Ω to the order of hundreds Ω if the short-type fault occurs. However, a testing device to detect an open-type fault of the parallel-connected passive elements is required to have high accuracy.

Generally, since a semiconductor device may include a protection circuit, such as protection diodes, a level of a test voltage applied to a device under test may be limited to a voltage range where the protection diodes do not operate. That is, to measure the open-type fault of the passive elements, the test voltage applied to the device under test may have the limited range. A conventional testing device measures a capacitance of parallel-connected capacitors by measuring a time required to charge and/or discharge the capacitors and a charging and/or discharging voltage using a DC test voltage. The conventional method using the DC test voltage may not have high accuracy to detect the open-type fault because of the limitations caused by the protection diodes in the semiconductor device.

The test system 30 according to FIGS. 10A and 10B, may measure a capacitance of a device under test using a test voltage having a test frequency determined such that the measured capacitance has a large difference with respect to a reference capacitance, and may analyze the measured capacitance using the element characteristic information of the capacitors. Accordingly, the test system 30 may accurately measure the capacitance of the device under test illustrated in FIGS. 10A and 10B, thereby accurately detecting the open-type fault of the capacitors.

FIGS. 11A, 11B and 11C are diagrams illustrating various exemplary embodiments of the device under test 500 illustrated in FIG. 7.

Referring to FIG. 11A, a device under test 500c may include a plurality of diodes D21, D22 and D2m that are connected in parallel. The plurality of diodes D21, D22 and D2m may be protection diodes in an input/output stage of a semiconductor device, such as a semiconductor memory device or a semiconductor circuit chip.

Referring to FIGS. 7 and 11B, a device under test 500d may include at least one semiconductor device 5201, 5202 and 520m having at least one input/output stage that are coupled to each other. Each semiconductor device 5201, 5202 and 520m may include at least one protection diode D211, D212, D221, D222, D2m1 and D2m2. A testing device 10 may measure an impedance of a signal path formed by an input/output line TLA, the protection diodes D211, D221 and D2m2, and a power supply line TLB to detect an open-type fault of at least one internal connection line of the at least one semiconductor device 5201, 5202 and 520m. Although it is not illustrated, the device under test 500d may further include a damping resistor between the input/output line TLA and the power supply line TLB to decrease a Q (i.e., "Quality") factor within the circuit and thereby eliminate ringing.

In some embodiments, the device under test 500*d* may be a memory module, such as a DIMM, a SIMM, etc, and the semiconductor devices 5201, 5202 and 520*m* may be semiconductor memory devices. As is the case of the memory module, if the semiconductor memory devices and various passive elements are mounted on a printed circuit board (PCB), a test voltage may be applied to a signal path including electro static discharge (ESD) protection diodes inside of the memory module to measure a PCB impedance. Since impedances of the ESD protection diodes changes according to a voltage applied to the ESD protection diodes, a calibration may be performed on the measured PCB impedance based on voltage-current characteristic information of the ESD protection diodes.

Referring to FIGS. 7 and 11C, a device under test 500*e* may include at least one semiconductor device 5301, 5302 and 530*m* having at least one input/output stage that are coupled to each other. Each semiconductor device 5301, 5302 and 530*m* may include at least one protection diode D311, D312, D321, D322, D3*m*1 and D3*m*2. A testing device 10 may measure an impedance of a signal path formed by an input/output line TLA, the protection diodes D312, D322 and D3*m*2, and a power supply line TLB to detect an open-type fault of at least one internal connection line of the at least one semiconductor device 5301, 5302 and 530*m*.

Referring again to FIGS. 1 and 11A, the signal processing unit 300 may compare measured levels of test output signals with a reference level in a case where the open-type fault does not occur, and may detect an open-type fault of passive elements D21, D22 and D2*m* based on element characteristic information EDI. In this case, the element characteristic information EDI may include information about respective resistances of the passive elements D21, D22 and D2*m* according to a level of an applied voltage, and information about the number of the passive elements D21, D22 and D2*m* corresponding to each resistance. Similar detection may be performed on devices under test illustrated in FIGS. 11B and 11C.

Referring again to FIGS. 1, 7 and 11B, the element characteristic information EDI of the protection diodes D211, D221 and D2*m*1 may include information about change in resistance of the protection diodes D211, D221 and D2*m*1 according to the applied voltage, and the accuracy of the signal sensing unit 310 may be improved based on the information about the change in resistance. The signal processing unit 300 may compare the test output signal with a reference resistance that is an expected resistance in a case where the open-type fault does not occur, and detect the open-type fault of an internal connection line between input/output stages of at least one semiconductor device 5201, 5202, 520*m* based on the element characteristic information EDI of the protection diodes D211, D221 and D2*m*1. A resistance difference between the reference resistance and the measured resistance may depend on the number of passive elements having the open-type fault, types of passive elements having the open-type fault, and a level of the applied voltage. In a case where the resistance difference is within a measurement error, the level of the applied voltage may be adjusted, and the reference resistance may be adjusted according to the adjusted level of the applied voltage.

As described above, the testing device 10 may detect the open-type fault of the internal connection line between the input/output stages of at least one semiconductor device 5201, 5202 and 520*m* based on the element characteristic information EDI of the protection diodes D211, D221 and D2*m*1. The accuracy in detecting the open-type fault of the internal connection line may be improved based on the element characteristic information EDI including information about the change in resistance of the protection diodes D211, D221 and D2*m*1 according to the applied voltage.

Figure 12:
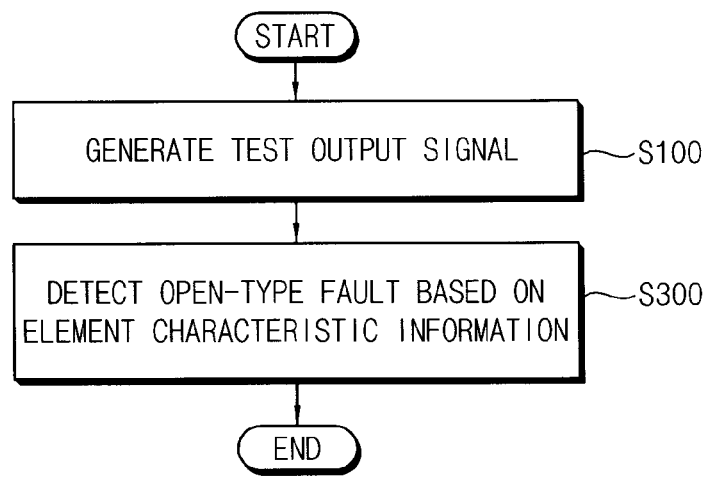
FIG. 12 is a flow chart illustrating a method of testing a device under test according to an exemplary embodiment of the present general inventive concept.

FIG. 12 is a flow chart illustrating a method of testing the device under test 500 according to an exemplary embodiment of the present general inventive concept.

Referring to FIGS. 1 and 12, the signal sensing unit 100 generates a test output signal SS by sensing a signal from the device under test 500 (S100). The signal processing unit 300 may measure an impedance of the device under test 500 by analyzing a waveform of the test output signal SS, and may detect an open-type fault of the passive elements included in the device under test 500 based on element characteristic information EDI of the passive elements (S300). The test method illustrated in FIG. 12 may be performed by the testing device 10 of FIG. 1 or the test system 30 of FIG. 7.

Figure 13:
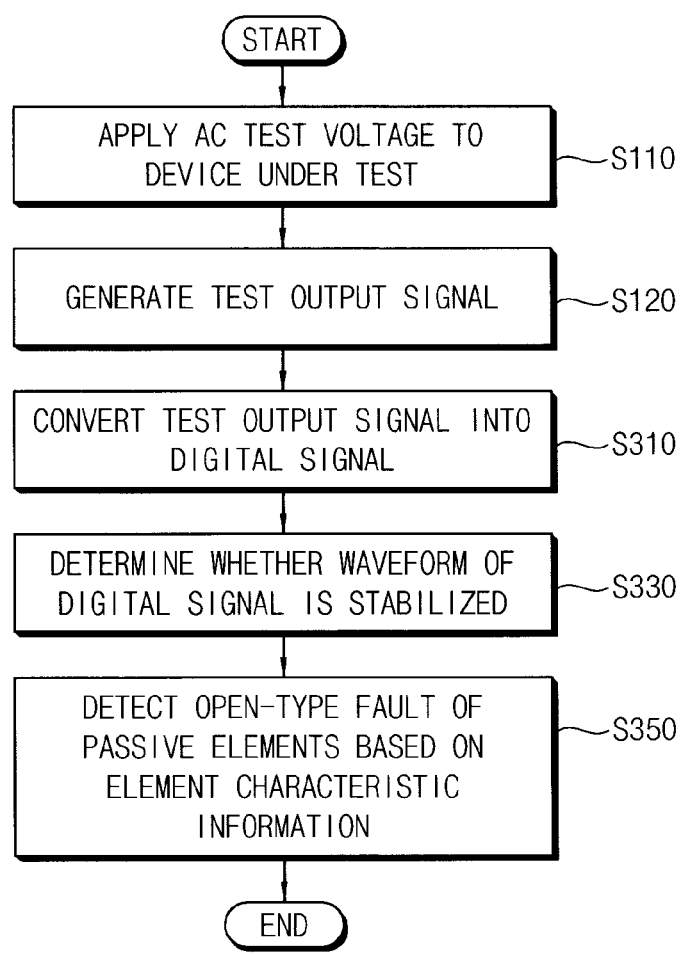
FIG. 13 is a flow chart illustrating an example of a test method illustrated in FIG. 12.

FIG. 13 is a flow chart illustrating an example of a test method illustrated in FIG. 12.

Referring to FIGS. 1, 2, 7 and 13, a signal sensing unit 100 may apply an AC test voltage to the device under test 500 (S110). The signal sensing unit 100 may generate a test output signal SS by sensing a voltage or a current output from the device under test 500 in response to the AC test voltage (S120). The voltage or the current output from the device under test 500 may depend on an amplitude and/or a frequency of the AC test voltage and electrical characteristics of passive elements included in the device under test 500. A signal processing unit 300 may convert the test output signal SS into a digital signal DS (S310). The signal processing unit 300 may determine whether a waveform of the digital signal DS is stabilized (S330). For example, the waveform of the digital signal DS may be decided to be stabilized if a deviation of the waveform of the digital signal DS is less than a threshold value. After the waveform of the digital signal DS is stabilized, the signal processing unit 300 may detect an open-type fault of the passive elements based on the digital signal DS and element characteristic information EDI of the passive elements (S350). The detection method illustrated in FIG. 13 may be performed by the testing device 10 of FIG. 1 or the test system 30 of FIG. 7.

Figure 14:
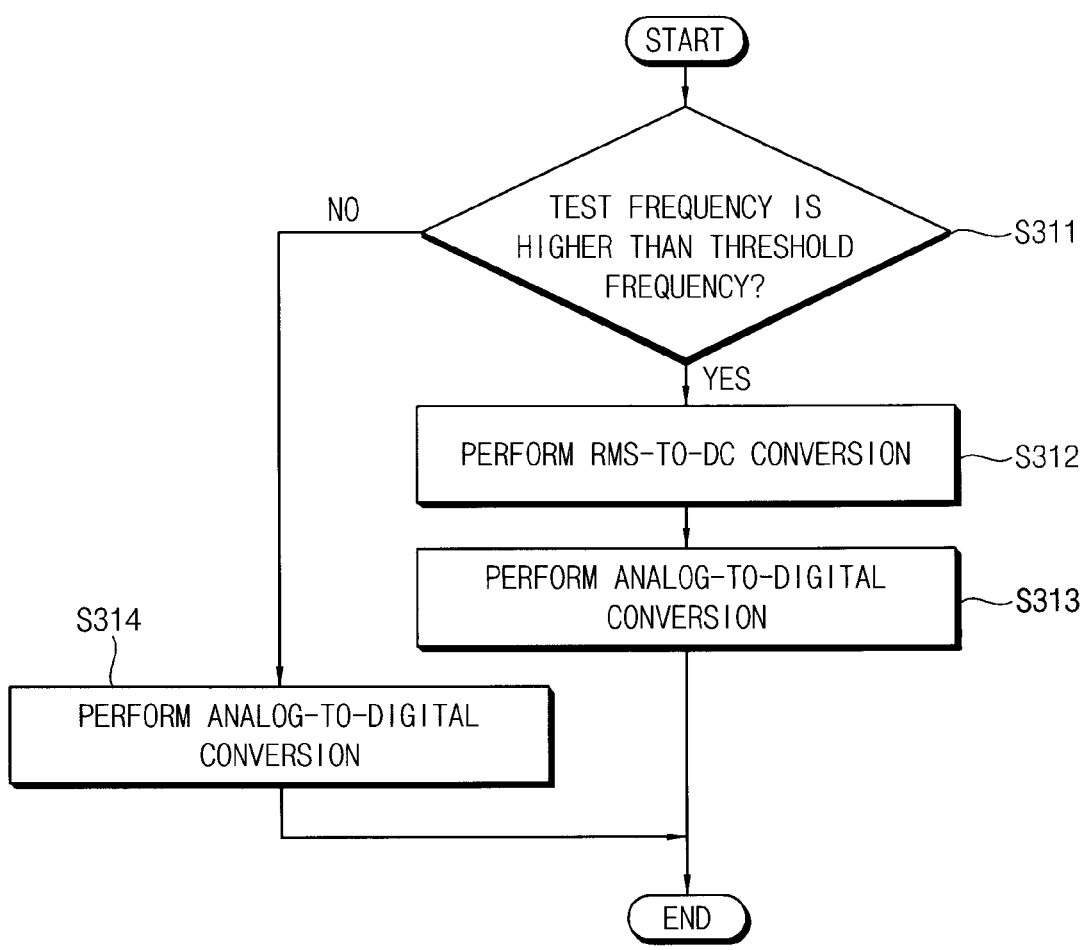
FIG. 14 is a flow chart illustrating an example of a signal conversion illustrated in FIG. 13.

FIG. 14 is a flow chart illustrating an example of a signal conversion illustrated in FIG. 13.

Referring to FIGS. 1, 2, 5A, 7 and 14, if a test frequency of a test voltage is higher than a threshold frequency (S311: YES), the signal processing unit 300 may perform an RMS-to-DC conversion and an analog-to-digital conversion on a test output signal SS to generate a first digital signal DS1 (S312, S313). The signal processing unit 300 may generate first feature information FV1 based on the first digital signal DS1. If the test frequency is equal to or lower than the threshold frequency (S311: NO), the signal processing unit 300 may perform an analog-to-digital conversion on the test output signal SS to generate the second digital signal DS2 (S314). The signal processing unit 300 may generate second feature information FV2 based on the second digital signal DS2. The signal processing unit 300 may detect an open-type fault of a plurality of capacitors by analyzing the first feature information FV1 or the second feature information FV2 using information about respective capacitances of the capacitors and information about the number of capacitors corresponding to each capacitance. The signal conversion illustrated in FIG. 14 may be performed by the testing device 10 of FIG. 1 or the test system 30 of FIG. 7.

Figure 15:
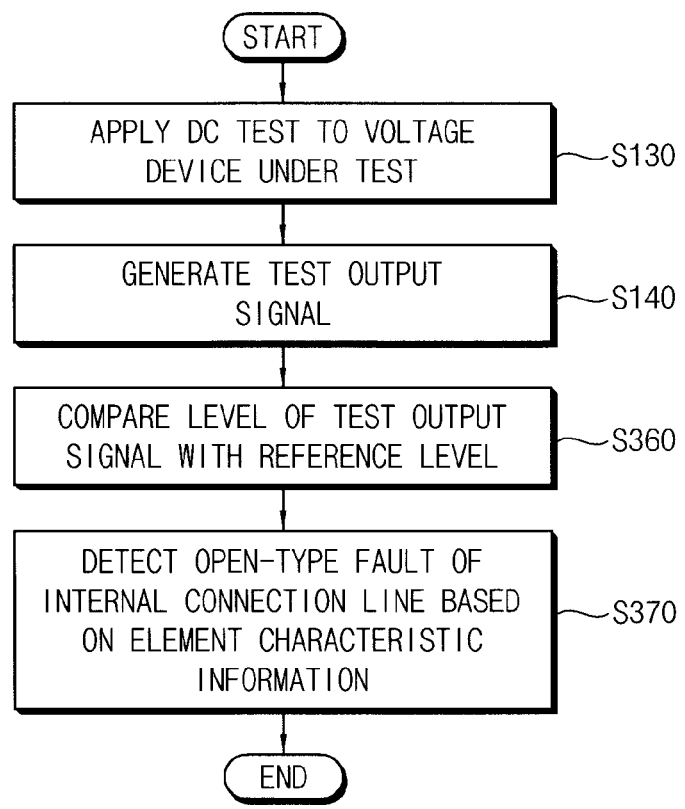
FIG. 15 is a flow chart illustrating another method of testing a device under test according to an exemplary embodiment of the present general inventive concept.

FIG. 15 is a flow chart illustrating another method of testing the device under test 500 according to an exemplary embodiment of the present general inventive concept.

Referring to FIGS. 1, 2, 4B and 15, a signal sensing unit 100 may apply a DC test voltage to the device under test 500 (S130). The signal sensing unit 100 may generate a test output signal SS by sensing a voltage or a current output from the device under test 500 in response to the DC test voltage (S140). The voltage or the current output from the device under test 500 may depend on a level of the DC test voltage and electrical characteristics of passive elements included in the device under test 500. A signal processing unit 300b may compare a level of the test output signal SSb with a level of a reference signal SR to generate a digital signal DSb corresponding to a difference between the level of the test output signal SSb and the level of the reference signal SR. The signal processing unit 300b may detect an open-type fault of internal connection lines between input/output stages of at least one semiconductor device included in the device under test 500 or an open-type fault of protection diodes included in the at least one semiconductor device based on the digital signal DSb and element characteristic information EDIb of the protection diodes (S370). The detection method illustrated in FIG. 15 may be performed by a testing device 10 of FIG. 1 or a test system 30 of FIG. 7.

As described above a method of detecting an open-type fault of passive elements according to exemplary embodiments may measure an impedance of the passive elements that are connected in parallel using element characteristic information of the passive elements, thereby accurately detecting the open-type fault of the passive elements included in a device under test, such as a printed circuit board on which semiconductor devices are mounted.

Although examples of devices under test including specific numbers of semiconductor devices and specific numbers of passive elements are described above, the device under test including various numbers of semiconductor devices and various numbers of passive elements may be tested by the method of detecting an open-type fault according to exemplary embodiments. In addition, although examples of devices under test including protection diodes are described above, the device under test including various types of protection circuits may be tested by the method of detecting an open-type fault according to exemplary embodiments. Further, examples of devices under test that are semiconductor modules including a plurality of semiconductor devices are described above, any device or module including passive elements that are connected in parallel may be tested by the method of detecting an open-type fault according to exemplary embodiments. Further, examples of devices under test including capacitors or resistors are described above, the device under test including other types of passive elements, such as inductors, may be tested by the method of detecting an open-type fault according to exemplary embodiments.

As described above, a testing device, a test system, and a method thereof according to exemplary embodiments may measure an impedance of parallel-connected passive elements, and may accurately detect an open-type fault of the passive elements included in a device under test using element characteristic information of the passive elements. Thus, the present general inventive concept may be applied to detecting the open-type fault of any device or module, such as a printed circuit board including semiconductor devices. In particular, the present general inventive concept may be applied to testing a semiconductor memory module.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A testing device, comprising:
    a signal sensing unit configured to generate a test output signal by sensing a signal from a device under test, the device under test including a plurality of passive elements that are connected in parallel; and
    a signal processing unit configured to measure an impedance of the device under test using the test output signal and to detect an open-type fault of the plurality of passive elements based on the measured impedance and element characteristic information of the plurality of passive elements,
    wherein the impedance of the plurality of passive elements is calculated by selectively using a first signal path and a second signal path based on a frequency of the test output signal.

2. The testing device of claim 1, wherein the signal processing unit comprises:
    a signal conversion unit to convert the test output signal into a digital signal; and
    a digital signal processing unit to determine whether a waveform of the digital signal is stabilized, and to detect, after the waveform of the digital signal is stabilized, the open-type fault of the plurality of passive elements based on the stabilized waveform of the digital signal and the element characteristic information.

3. The testing device of claim 2, wherein the digital signal processing unit comprises:
    a memory unit to store the digital signal; and
    a waveform distortion measuring unit to determine whether the waveform of the digital signal is stabilized based on the digital signal stored in the memory unit.

4. The testing device of claim 2, wherein the digital signal processing unit comprises:
    a feature extracting unit to generate feature information based on the digital signal; and
    a faulty element detecting unit to detect the open-type fault of the plurality of passive elements based on the feature information and the element characteristic information.

5. The testing device of claim 1, wherein the plurality of passive elements includes capacitors, and
    wherein the signal processing unit measures a total capacitance of the capacitors, compares the measured capacitance with a reference capacitance that is a total capacitance of the capacitors having no open-type fault, and determines which one of the capacitors has the open-type fault based on a difference of the measured capacitance and the reference capacitance, information about respective capacitances of the capacitors, and information about a number of the capacitors corresponding to each capacitance.

6. The testing device of claim 1, wherein the signal sensing unit sequentially applies test voltages having different test frequencies to the device under test, and generates the test output signal by sensing the signal generated from the device under test in response to the test voltages.

7. The testing device of claim 1, wherein the signal processing unit detects the open-type fault of the plurality of passive elements based on a frequency characteristic that an impedance of the plurality of passive elements changes according to a frequency of a test voltage applied to the plurality of passive elements.

8. The testing device of claim 1, wherein the signal processing unit detects the open-type fault of the plurality of passive elements based on an error characteristic that an impedance of the plurality of passive elements changes according to a level of a test voltage applied to the plurality of passive elements.

9. The testing device of claim 1, wherein the plurality of passive elements include resistors, and
   wherein the signal processing unit compares a level of the test output signal with a reference level that is a level of the test output signal in a case where the resistors have no open-type fault, and determines which one of the resistors has the open-type fault based on a difference between the level of the test output signal and the reference level, information about respective resistances of the resistors according to a level of a test voltage applied to the device under test, and information about a number of the resistors corresponding to each resistance.

10. A testing device, comprising:
   a signal sensing unit configured to generate a test output signal by sensing a signal from a device under test, the device under test including a plurality of passive elements that are connected in parallel; and
   a signal processing unit configured to measure an impedance of the device under test using the test output signal and to detect an open-type fault of the plurality of passive elements based on the measured impedance and element characteristic information of the plurality of passive elements,
   wherein the signal processing unit comprises:
   a signal conversion unit to convert the test output signal into a digital signal; and
   a digital signal processing unit to determine whether a waveform of the digital signal is stabilized, and to detect, after the waveform of the digital signal is stabilized, the open-type fault of the plurality of passive elements based on the stabilized waveform of the digital signal and the element characteristic information,
   wherein the signal conversion unit performs an RMS-to-DC conversion on the test output signal in response to a frequency of the test output signal being higher than a threshold frequency, and
   wherein the digital signal processing unit detects the open-type fault of the plurality of passive elements based on a result of the RMS-to-DC conversion.

11. A testing device, comprising:
   a signal sensing unit configured to generate a test output signal by sensing a signal from a device under test, the device under test including a plurality of passive elements that are connected in parallel; and
   a signal processing unit configured to measure an impedance of the device under test using the test output signal and to detect an open-type fault of the plurality of passive elements based on the measured impedance and element characteristic information of the plurality of passive elements,
   wherein the signal processing unit comprises:
   a signal conversion unit to convert the test output signal into a digital signal; and
   a digital signal processing unit to determine whether a waveform of the digital signal is stabilized, and to detect, after the waveform of the digital signal is stabilized, the open-type fault of the plurality of passive elements based on the stabilized waveform of the digital signal and the element characteristic information, and
   wherein the signal conversion unit comprises:
   an RMS-to-DC converter disposed on a first signal path to convert an RMS value of the test output signal into a DC value;
   a first analog-to-digital converter disposed on the first signal path to convert the DC value into the digital signal;
   a second analog-to-digital converter disposed on a second signal path to convert the test output signal into the digital signal; and
   a switch to selectively provide the first signal path or the second signal path with the test output signal received from the signal sensing unit.

12. The testing device of claim 11, wherein the signal conversion unit converts the test output signal via the first signal path in response to a frequency of the test output signal being higher than a threshold frequency, and converts the test output signal via the second signal path in response to the frequency of the test output signal being equal to or lower than the threshold frequency.

* * * * *